BASS BOOST CIRCUIT

Filed May 24, 1947

INVENTOR.
Gus W. Wallin

BY
Foorman L. Mueller
ATTORNEY.

Patented Oct. 23, 1951 2,572,544

UNITED STATES PATENT OFFICE 2,572,544

BASS BOOST CIRCUIT

Gus W. Wallin, Chicago, Ill., assignor to Motorola, Inc., a corporation of Illinois Application May 24, 1947, Serial No. 750,316

4 Claims. (Cl. 179—171)

This invention relates generally to audio systems and more particularly to a feed-back circuit for improving the low frequency response of the audio amplifier of a radio receiver.

Small radio receivers have had tremendous popular appeal and the trend is to make inexpensive receiver sets smaller and smaller. However, it is desired that the audio output of such small receivers be of high fidelity. This is particularly difficult in small receivers as the small cabinets used do not provide sufficient room for a large speaker and small speakers inherently have very poor response at low frequency. It is a generally accepted fact that the response to the human ear is such that an increased response at low frequencies is desired for good listening and, therefore, the deficiency of small receivers appears more pronounced.

A further factor which contributes to the poor low frequency response of small radio receivers is that such receivers are relatively inexpensively constructed and the audio circuit itself tends to attenuate the lower frequencies. Although various bass boost systems have been developed for improving the response at low frequencies, these systems have generally required larger output transformers and/or electrolytic condensers which are relatively expensive items and, therefore, appreciably increase the cost of the manufacture of such a set.

It is, therefore, an object of the present invention to provide a simple and inexpensive arrangement for improving the fidelity of radio receivers.

It is another object of the present invention to provide a feed-back circuit for an audio amplifier which provides regenerative action at relatively low frequencies and is substantially ineffective at high frequencies.

Still another object of this invention is to provide a feed-back system for improving the low frequency or bass response of an audio amplifier in which relatively large feed-back voltages can be used without causing oscillations in the amplifier.

A feature of this invention is the provision of a feed-back link between the output and the input circuits of an audio amplifier which requires only standard and inexpensive components and which is effective to increase the low frequencies response of the amplifier.

Another feature of the present invention is the provision of a bass boost circuit for an audio amplifier in which a simple filter is utilized to provide a substantially increased response at low audio frequencies and a relatively small increase in response at higher audio frequencies.

A further feature of this invention is the provision of a feed-back circuit for an audio amplifier in which the voltage fed back to the input in the frequency range between 100 to 300 cycles is relatively large but the component of the voltage in-phase with the input is sufficiently small to prevent oscillation of the amplifier.

Further objects, features and advantages will be apparent from a consideration of the following description taken in connection with the accompanying drawings in which.

Figures 1, 2, 3, 4:
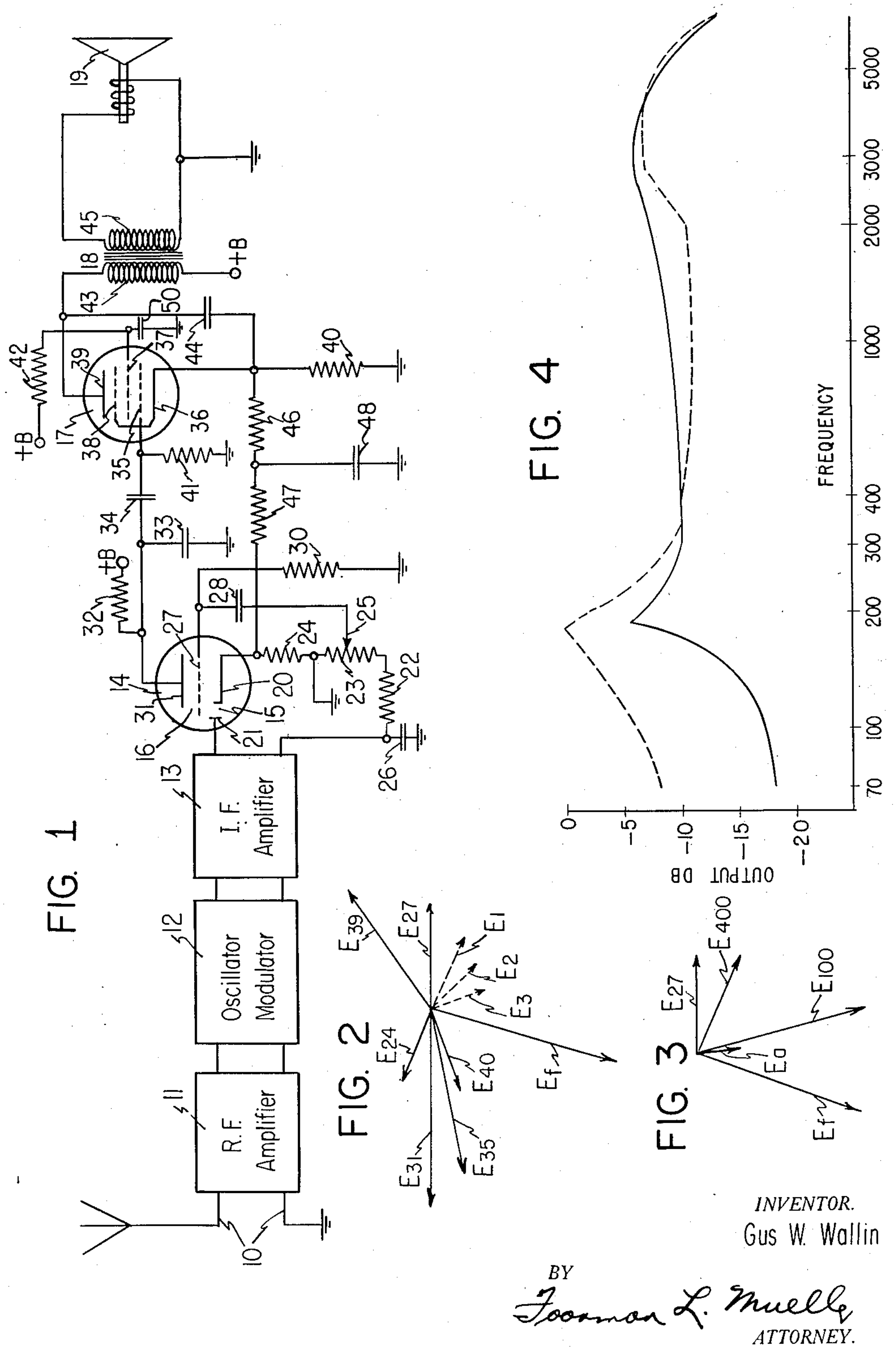
Fig. 1 illustrates a radio receiver circuit embodying the features of my invention.
Fig. 2 is a vector diagram showing the voltages in the circuit.
Fig. 3 is a vector diagram illustrating the operation of my circuit at various frequencies.
Fig. 4 is a chart showing the improvement in the low frequency response in accordance with the invention.

In practicing my invention I provide a small radio receiver including a two-stage audio amplifier. A portion of the output of the amplifier is fed back to the input thereof, this portion being fed back through a simple filter arrangement which is designed to pass frequencies below 400 cycles and to attenuate frequencies above 400 cycles. The filter is arranged so that the portion of the feed-back voltage which is in-phase with the input of the amplifier is relatively small at all frequencies to prevent oscillations in the amplifier. The phase quadrature component of the feed-back voltage is large at low frequencies to provide increased response at such frequencies.

Referring now to the drawings, in Fig. 1 there is illustrated a superheterodyne radio receiver including an antenna system 10, a radio frequency amplifier 11, oscillator-modulator 12 and intermediate frequency amplifier 13. These components may be of any suitable design, the specific construction thereof not being a part of the present invention. The output of the intermediate frequency amplifier 13 is applied to tube 14 including a diode section 15 for deriving audio signals from the intermediate frequency signal and a triode section 16 which functions as the first audio amplifier of the system. The audio signal is then applied to pentode tube 17 which functions as an audio output amplifier and is coupled to a transformer 18 which applies audio signals to a sound reproducing unit or loud speaker 19. Although the function of the diode detector and audio amplifiers is typical, these units will be described in detail in order to provide a complete understanding of the invention.

As stated above, the output of the intermediate frequency amplifier 13 is applied to the diode section 15 of the vacuum tube 14, this diode being formed by cathode 20 and plate 21. The signals from the intermediate frequency amplifier are applied to the diode through resistors 22, 23 and 24 across which the audio signals are developed. The resistor 23 is of the potentiometer type having a movable contact 25 and is used to control the volume of the signal applied to the audio amplifier. For the purpose of bypassing the intermediate frequency signals a condenser 26 is provided which is in effect bridged across the diode load. The audio frequency signals developed by the detector are applied to the triode section 16 of the tube 14, the signals being applied from the movable contact 25 through coupling condenser 28 to the grid 27 of the triode. It is seen that the portion of the audio signal applied to the triode depends upon the position of the movable contact 25 so that the resistor 23 functions as a volume control for the amplifier. The grid 27 of the triode is biased by resistor 30 and operating potential is applied to the plate 31 thereof through resistor 32 which is connected to a source of potential marked +B. The triode 16 functions to amplify the audio signals applied thereto, the amplified signals being applied through blocking condenser 34 to the grid 35 of the pentode power amplifier tube 17. Condenser 33 is also connected to the plate 31 of the triode for bypassing high frequency signals which might be present due to interaction between the diode and triode sections of the tube 14.

The power amplifier tube 17 is of the pentode type including cathode 36, control grid 35, screen grid 37, suppressor grid 38 and plate 39. The cathode and suppressor grid are connected to ground through resistor 40. As previously stated the signal from the amplifier section 16 is applied to grid 35, the grid being biased by resistor 41. The screen grid 37 is connected to a source of potential through resistor 42 and is bypassed by condenser 50. The plate of the pentode is also connected to the +B potential, being connected through the primary winding of output transformer 18. A capacitor 44 is connected across the pentode to bypass any high frequency currents present as well as to present a more constant impedance to the tube at higher audio frequencies. The audio output is applied from the primary winding 43 of transformer 18 to the secondary winding 45 thereof which is connected across loud speaker 19 which reproduces the signals applied thereto.

For feeding the voltage developed across resistor 40 when the pentode draws plate current to the input of the amplifier, a feed-back circuit comprising resistors 46 and 47 and condenser 48 is provided. This circuit is arranged to apply the voltage across the resistor 24 which is in the input circuit to the triode amplifier 16. The feed-back circuit is a T network which functions to vary both the magnitude and the phase of the feed-back voltage in accordance with frequency. The circuit can be designed to be effective at various desired frequencies but for use in an audio system of a small radio receiver it is preferable that voltages fed back in the frequency range from 70 to 300 cycles be of such magnitude to provide strong regenerative action in the amplifier.

Considering now the operation of the audio amplifier and in particular the bass boost or feed-back circuit thereof, reference is made to Fig. 2 which is a vector diagram illustrating the various voltages developed therein. The voltage on grid 27 of the first audio amplifier tube is used as a reference in the vector diagram and is designated $E_{27}$. The corresponding plate voltage is designated $E_{31}$ being opposite to and of greater magnitude than the grid voltage. This voltage is applied to the grid 35 of the power amplifier being slightly reduced in magnitude and shifted in phase by the coupling components, the voltage on the grid 35 being designated in Fig. 2 as $E_{35}$. The plate voltage of the power amplifier which is the output voltage of the amplifier is much larger than the grid voltage and substantially 180° out-of-phase therewith, being designated as $E_{39}$ in Fig. 2. As is well known, the voltage on the cathode 36 of the amplifier tube will be substantially 180° out-of-phase with the plate voltage following generally the voltage of the grid. This voltage appears across resistor 40 and is indicated on the vector diagram as $E_{40}$. The feed-back circuit applies the voltage across resistor 40 to the resistor 24, the voltage being shifted in phase and slightly reduced in magnitude as indicated by $E_{24}$ on the vector diagram.

As is apparent from Fig. 1, the voltage from the feed-back circuit is applied to resistor 24 in opposing phase relation to the voltage applied thereto by the detector so that the feed-back voltage which is positive with respect to ground will tend to make the grid 27 negative with respect to ground and, therefore, the feed-back voltage must be reversed as shown by vector $E_1$. It is obvious that this feed-back cycle will continue to be repeated with the result that the feed-back voltage appearing across resistor 24 will continually build up. The effect of the feed-back circuit in reducing the voltage is greater than the amplification thereof by the amplifier so that the increments fed back will continually decrease. The vectors $E_2$ and $E_3$ represent the successive cycles of the feed-back and the vector $E_f$ represents the sum of such successive vectors. This sum was obtained by following the feed-back through a plurality of cycles with each successive increment becoming smaller and smaller until the effect thereof is not substantial. It is noted that the resulting voltage is substantially in-phase quadrature with the audio input to the amplifier.

In Fig. 3 there is illustrated the comparison of the feed-back voltages at frequencies of 100 cycles and at 400 cycles. The vector $E_{27}$ indicates the input voltage and vector $E_f$ represents the resulting feed-back voltage at a frequency of 100 cycles after a large number of cycles. These voltages combine to provide a voltage $E_{100}$ which is substantially greater than the original input voltage $E_{27}$. At 400 cycles the feed-back voltage in each cycle is much smaller and the magnitude diminishes more rapidly on each succeeding cycle resulting in a total feed-back voltage at 400 cycles very small as compared to the feed-back voltage at 100 cycles. This voltage is indicated on Fig. 3 as $E_a$ and the combined voltage resulting from $E_{27}$ and $E_a$ is indicated as $E_{400}$. It is, therefore, seen that the voltage applied to the input at 400 cycles is not substantially increased due to the feed-back circuit. In the design of the feed-back circuit it is necessary that the component of the feed-back voltage which is in-phase with the amplifier input be kept small to prevent oscillations of the amplifier. In accordance with the invention the quadrature component becomes large at low frequencies to increase the signal strength at such frequencies without causing oscillation.

Fig. 4 illustrates the improvement in fidelity obtained by use of the bass boost circuit in accordance with the invention. The normal output of the audio amplifier is shown by the solid curve and the response obtained when using the bass boost circuit in accordance with the invention is shown by the dotted line. It is apparent that in the range from 70 cycles to about 170 cycles a gain of approximately 10 decibels is obtained and a substantial gain results up to 300 cycles. It is also apparent from Fig. 4 that the over-all response of the receiver is a maximum in the vicinity of 200 cycles thereby providing increased low frequency response as is necessary for good listening because of the inherent characteristics of the human ear.

The bass boost circuit in accordance with the invention has been applied to audio amplifiers and found satisfactory, the following values being used in one amplifier constructed:

| | |
|---|---|
| Tube **17** | Type 35A5 |
| Resistor **40** ohms | 150 |
| Resistor **46** do | 1,500 |
| Resistor **47** do | 1,500 |
| Capacitor **48** microfarad | 1.0 |
| Resistor **24** ohms | 100 |
| Potentiometer **23** ohms (max.) | 500,000 |

It is apparent that these values may be changed as required for a particular circuit or to provide a particular response. It also is apparent that the circuit may be somewhat simplified by combining the resistor 24 and the potentiometer 23 as a single potentiometer and providing a tap thereon which may be grounded.

The feedback circuit comprising resistors 46, 47 and condenser 48 for transferring voltage from the cathode resistor 40 of tube 17 to the cathode resistor 24 of tube 16 is subject to accurate mathematical analysis for determining the characteristics thereof. The relation of the voltage across resistor 24, which we have designated $E_{24}$, with respect to the voltage across resistor 40, which we have designated $E_{40}$, is given by the following formula:

$$E_{24}=E_{40}\times\frac{R_{24}}{R_{24}+R_{46}+R_{47}+jwC_{48}R_{46}(R_{24}+R_{47})}$$

By proper selection of the values of the elements of the feedback circuit, the desired amplitude and phase of the voltage applied to resistor 24 can be obtained. By using the values given above, the voltage applied to resistor 24 from resistor 40 will be in accordance with the following formula:

$$E_{24}=E_{40}\times\frac{1}{31+j0.151f}$$

where $f$ is the frequency in cycles per second. By substituting in this formula it will be apparent that the magnitude of the feedback voltage decreases with increasing frequency and the phase shift increases with frequency. This results in increased feedback at low frequency with respect to high frequency and yet provides voltages such that oscillations are not produced in the amplifier at any frequency. The following table gives values of the amplitude of the feedback voltages at various frequencies, and the phase angle thereof with respect to the voltage across resistor 40. The phase angle with respect to the voltage applied to grid 27 is shown in Figs. 2 and 3.

| Frequency, Cycles per second | Feedback Voltage; Portion of Voltage at Resistor 40 | Phase Angle with Respect to Voltage at Resistor 40 |
|---|---|---|
| | | *Degrees* |
| 50 | .0314 | −13.7 |
| 100 | .029 | −26.0 |
| 200 | .023 | −44.25 |
| 400 | .0149 | −62.5 |
| 1000 | .00662 | −78.6 |
| 2000 | .0033 | −84.15 |
| 5000 | .00304 | −87.64 |

It is seen from the above that I have provided a bass boost or feed-back circuit which is effective to improve the low audio frequency response of an audio amplifier. The circuit is very simple and does not appreciably increase the cost of the audio amplifier as the only components added are resistors 46 and 47 and capacitor 48, all of which are very inexpensive items. The circuit does not require the use of an electrolytic condenser or the use of a larger output transformer or a transformer having special characteristics as the feed-back circuit will compensate for the inherent deficiencies in the output transformer. This eliminates the added cost of prior bass boost circuits.

Although I have described a preferred embodiment of my invention, it is apparent that various changes and modifications can be made therein without departing from the intended scope of the invention as defined in the appended claims.

I claim:

1. An audio amplifier system including a first electron discharge valve of the triode type having a cathode, an anode, and a control grid, means for applying an audio signal to said control grid, resistance means connected between said cathode and ground, said resistance means having such value that the amplification of said electron discharge valve is not substantially reduced thereby, a second electron discharge valve having a cathode, an anode, and a control grid, a coupling circuit connecting said anode of said first valve to said control grid of said second valve, a resistor connected between said cathode of said second valve and ground, an output circuit connected to said plate of said second valve, and a feedback network coupling said cathode of said second valve to said cathode of said first valve, said feedback network having such characteristics that the feedback voltage applied across said resistance means is substantially equal to the voltage across said resistor divided by $31+j0.15\times$the frequency in cycles per second, so that high audio frequency signals are attenuated more than low audio frequency signals and the output of said amplifier at low audio frequencies is substantially increased, and the phase of said low audio frequency signals is shifted so that the component of said feedback signal which is in phase with said audio signal applied to said first electron discharge valve is relatively small and the tendency of said amplifier system to oscillate is thereby reduced.

2. An audio amplifier system including a first electron discharge valve of the triode type having a cathode, an anode and a control grid, means for applying an audio signal to said control grid, resistance means connected between said cathode and ground, said resistance means having such value that the amplification of said electron discharge valve is not substantially reduced thereby, a second electron discharge valve having a cathode, an anode and a control grid, a coupling circuit connecting said anode of said first valve to said control grid of said second valve, a resistor connected between said cathode of said second valve and ground, an output circuit connected to said plate of said second valve, and a feedback network providing regenerative coupling between said cathode of said second valve and said cathode of said first valve, said feedback network substantially attenuating audio signals having a frequency above 400 cycles per second and passing audio signals having a frequency below 300 cycles per second without substantial attenuation so that the output of said amplifier at low audio frequencies is increased, said feedback circuit shifting the phase of said signals passed thereby so that the component of said feedback signal which is in phase with said audio signal applied to said first electron discharge valve is relatively small at all frequencies and the tendency of said amplifier system to oscillate is thereby reduced.

3. An audio amplifier system in accordance with claim 1 in which said feedback network includes a pair of resistors connected in series between said cathodes and a capacitor connected between the common connection between said pair of resistors and ground.

4. An audio amplifier system including a first electron discharge valve of the triode type having a cathode, an anode and a control grid, means for applying an audio signal to said control grid, a second electron discharge valve having a cathode, an anode and a control grid, a coupling circuit connecting said anode of said first valve to said control grid of said second valve, first and second resistors individually connected between said first and second cathodes of said valves and ground, each of said resistors having a value of the order of 150 ohms or less so that the amplification of said electron discharge valves is not substantially reduced by degenerative action of said cathode resistors, and a feedback filter providing regenerative coupling between said cathodes of said valves, said feedback filter including a pair of resistors connected in series between said cathodes of said valves and a capacitor connected between the common connection between said pair of resistors and ground, said resistors and capacitor of said feedback filter having such values that the portion of the voltage applied from said second resistor to said first resistor at a frequency of 400 cycles per second is of the order of one-half or less of the voltage applied from said second resistor to said first resistor at a frequency of 100 cycles per second, and the phase shift of the voltage applied from said second resistor to said first resistor at 400 cycles per second is of the order of 62° lagging and at 100 cycles per second is of the order of 26° lagging, whereby the component of said feedback voltage which is in phase with the audio signal applied to said first electron discharge valve is relatively small at all frequencies and the tendency of said amplifier system to oscillate is thereby reduced.

GUS W. WALLIN.

REFERENCES CITED

The following references are of record in the file of this patent:

UNITED STATES PATENTS

| Number | Name | Date |
|---|---|---|
| 2,173,426 | Scott | Sept. 19, 1939 |
| 2,313,098 | Shepard Jr. | Mar. 9, 1943 |
| 2,366,565 | Shea et al. | Jan. 2, 1945 |
| 2,408,242 | Toomim | Sept. 24, 1946 |